(12) United States Patent
Chang

(10) Patent No.: US 9,706,680 B2
(45) Date of Patent: Jul. 11, 2017

(54) CABLE MANAGEMENT SYSTEM

(71) Applicant: Nan Juen International Co., Ltd.

(72) Inventor: Fu-Tien Chang, New Taipei (TW)

(73) Assignee: Nan Juen International Co., Ltd., New Taipei (TW)

( * ) Notice: Subject to any disclaimer, the term of this patent is extended or adjusted under 35 U.S.C. 154(b) by 100 days.

(21) Appl. No.: 14/699,653

(22) Filed: Apr. 29, 2015

(65) Prior Publication Data

US 2016/0238159 A1 Aug. 18, 2016

(30) Foreign Application Priority Data

Feb. 17, 2015 (TW) .............................. 104105504 A

(51) Int. Cl.
*F16L 3/015* (2006.01)
*H05K 7/18* (2006.01)
*H05K 7/14* (2006.01)

(52) U.S. Cl.
CPC ........... *H05K 7/183* (2013.01); *H05K 7/1491* (2013.01)

(58) Field of Classification Search
CPC .... G06F 3/0635; H05K 7/1489; H05K 7/183; H05K 7/1491; H05K 7/18
See application file for complete search history.

(56) References Cited

U.S. PATENT DOCUMENTS

| | | | | |
|---|---|---|---|---|
| 7,189,924 B1* | 3/2007 | Popescu | ............... | H05K 7/1491 174/69 |
| 7,473,846 B2* | 1/2009 | Doerr | .................... | H05K 7/1491 174/68.3 |
| 8,231,014 B2* | 7/2012 | Chen | .................... | H02G 3/0456 211/175 |
| 8,729,389 B2* | 5/2014 | Hallett | ................. | H05K 7/1491 174/99 R |
| 2006/0113433 A1* | 6/2006 | Chen | .................... | H05K 7/1491 248/70 |
| 2007/0227756 A1* | 10/2007 | Doerr | .................... | H05K 7/1491 174/69 |
| 2007/0258212 A1* | 11/2007 | Malone | ................ | H05K 7/1421 361/699 |
| 2009/0078834 A1* | 3/2009 | Chen | .................... | H01R 9/2416 248/70 |
| 2009/0261213 A1* | 10/2009 | Yu | ......................... | H05K 7/1491 248/68.1 |
| 2012/0193485 A1* | 8/2012 | Yu | ......................... | H05K 7/1491 248/68.1 |

* cited by examiner

*Primary Examiner* — James Wu
*Assistant Examiner* — Michael Matey

(57) ABSTRACT

A cable management system includes a sliding rail setcable and management racks coupled to the sliding rail set. Each cable management rack includes a first mounting member affixed to one respective inner sliding rail of the sliding rail set, a second mounting member affixed to a link between two intermediate sliding rails of the sliding rail set, a hinge, and a first support member and a second support member respectively made by bending a respective metal wire rod into shape and respectively pivotally connected between the first and second mounting members and two opposite ends of the hinge. Thus, a large open space is defined in each of the first support member and the second support member for air circulation and heat dissipation.

5 Claims, 7 Drawing Sheets

CABLE MANAGEMENT SYSTEM

BACKGROUND OF THE INVENTION

1. Field of the Invention

The present invention relates to cable management designs, and more particularly to a cable management system for mounting in a machine housing to slidably support an electronic device and to hold cables of the electronic device, which provides large open spaces therein so that the electronic device can dissipate waste heat efficiently.

2. Description of the Related Art

Many cable management systems are known for use in a machine housing to support an electronic device and to hold cables of the electronic device, allowing the electronic device to be conveniently moved in and out of the machine housing by the user and avliding tangled cables. However, conventional cable management systems commonly comprise multiple plate members pivotably connected together for holding cables. When the electronic device is received inside the machine housing, the plate menders of the cable management system are arranged together to shield a major part of the rear side of the electronic device, interfering with the heat dissipation functioning of the electronic device.

SUMMARY OF THE INVENTION

The present invention has been accomplished under the circumstances in view. It is therefore the main object of the present invention to provide a cable management system, which has major component parts of the cable management racks thereof made of a metal wire rod by bending, providing a large open space therein for heat dissipation.

To achieve this and other objects of the present invention, a cable management system comprises a sliding rail set for supporting an electronic device, and at least one cable management rack connected to the sliding rail set for holding cables of the electronic device in a good order. Each cable management rack comprises a first mounting member, a second mounting member, a hinge, a first support member and a second support member. The hinge is coupled between the first mounting member and the second mounting member. The first support member is coupled between the first mounting member and one end of the hinge. The second support member is coupled between the second mounting member and an opposite end of the hinge. The hinge comprises a first hinge plate, a second hinge plate and a pivot pin. The first hinge plate comprises at least one first barrel located at one end thereof, and two first receptacles located at an opposite end thereof. The second hinge plate comprises at least one second barrel located at one end thereof and pivotally connected to the at least one first barrel of the first hinge plate by the pivot pin, and two second receptacles located at an opposite end thereof. The first support member and the second support member are respectively made by bending a respective metal wire rod into shape. The first support member comprises a first pivot connection portion located at one end thereof and pivotally connected to the first mounting base, and two first plug tips located at an opposite end thereof and respectively fastened to the first receptacles of the first hinge plate. The second support member comprises a second pivot connection portion located at one end thereof and pivotally connected to the second mounting member, and two second plug tips located at an opposite end thereof and respectively fastened to the second receptacles of the second hinge plate. Thus, a large open space is defined in the first support member and the second support member, minimizing the shielding area at the back side of the electronic device, enabling the electronic device to dissipate heat efficiently.

Further, each cable management rack comprises a plurality of cable holder frames mounted at the respective first support member and second support member. Each cable holder frame comprises a frame base made by bending a metal wire rod into shape, and a top cover plate covered on the top side of the frame base. The frame bases of the cable holder frames are respectively affixed to the first support member and the second support member, and spaced along the length thereof away from the first plug tips and second plug tips.

DETAILED DESCRIPTION OF THE PREFERRED EMBODIMENT

Figure 1:
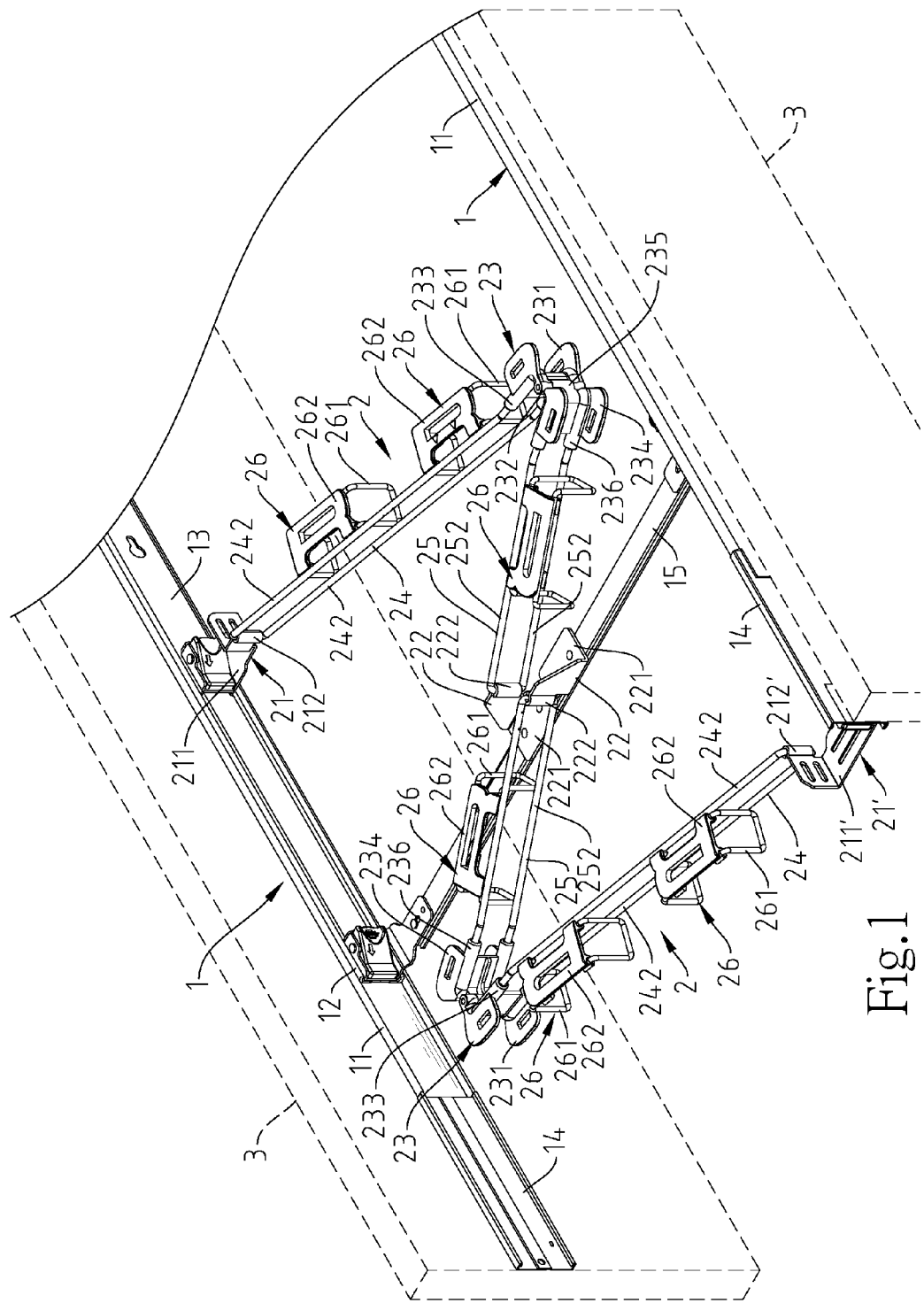
FIG. 1 illustrates a cable management system mounted in a machine housing in accordance with the present invention.
Figure 2:
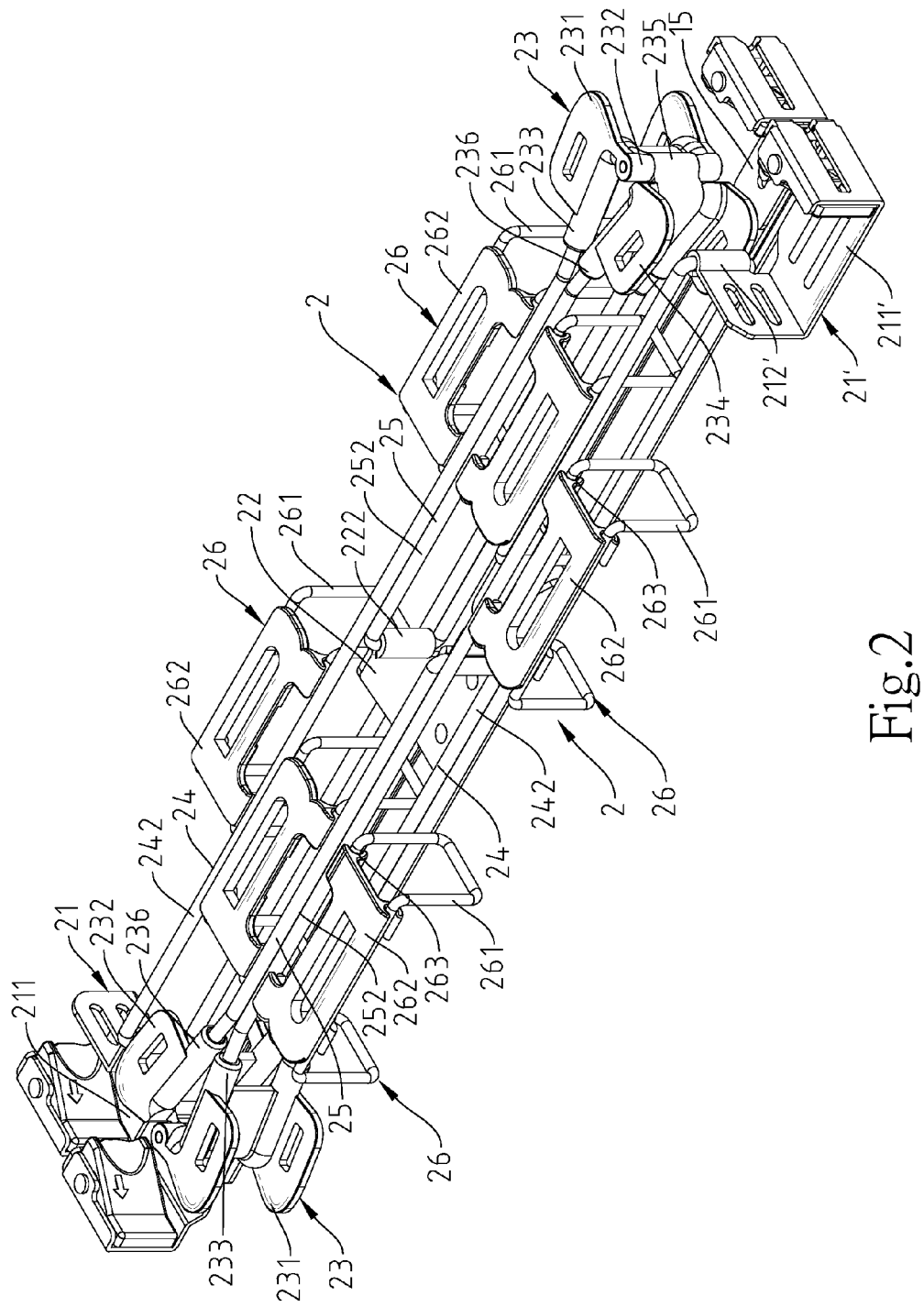
FIG. 2 is an elevational view of the present invention, illustrating the cable management system collapsed.
Figure 3:
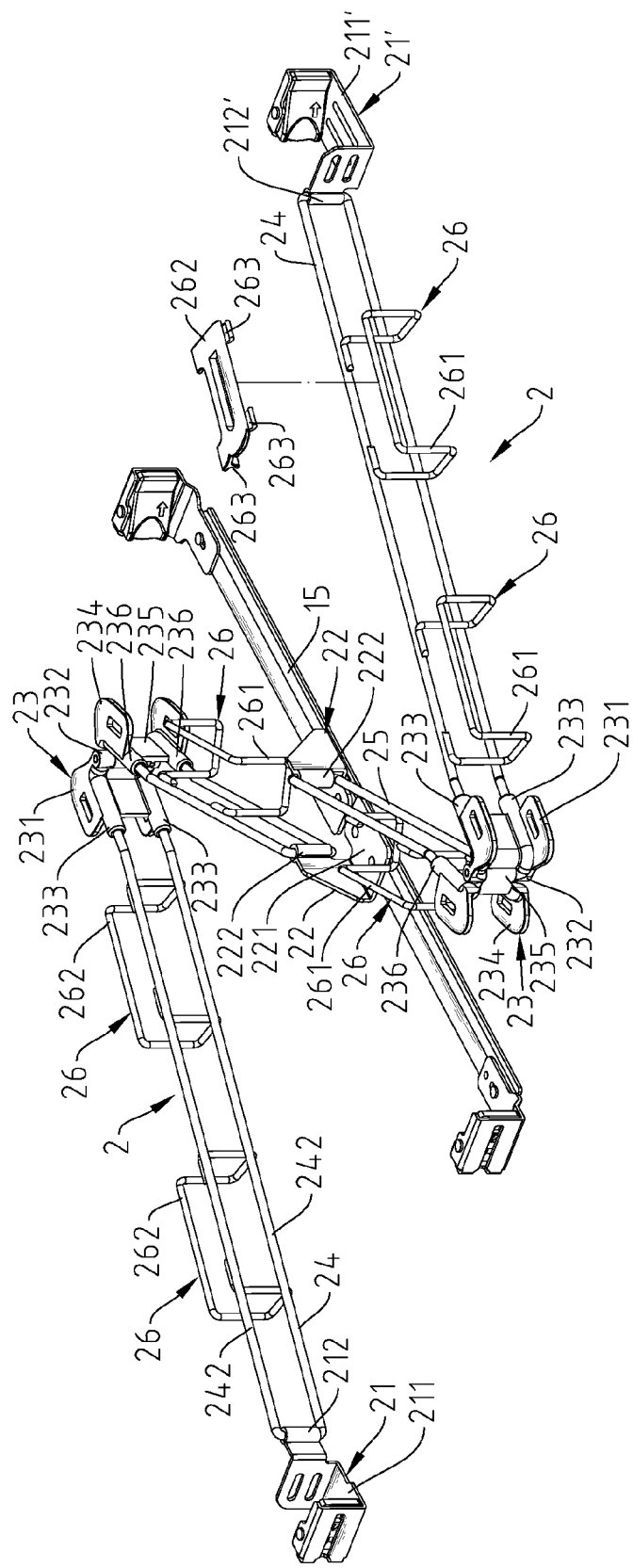
FIG. 3 illustrates an extended status of the major part of the cable management system in accordance with the present invention.
Figure 4:
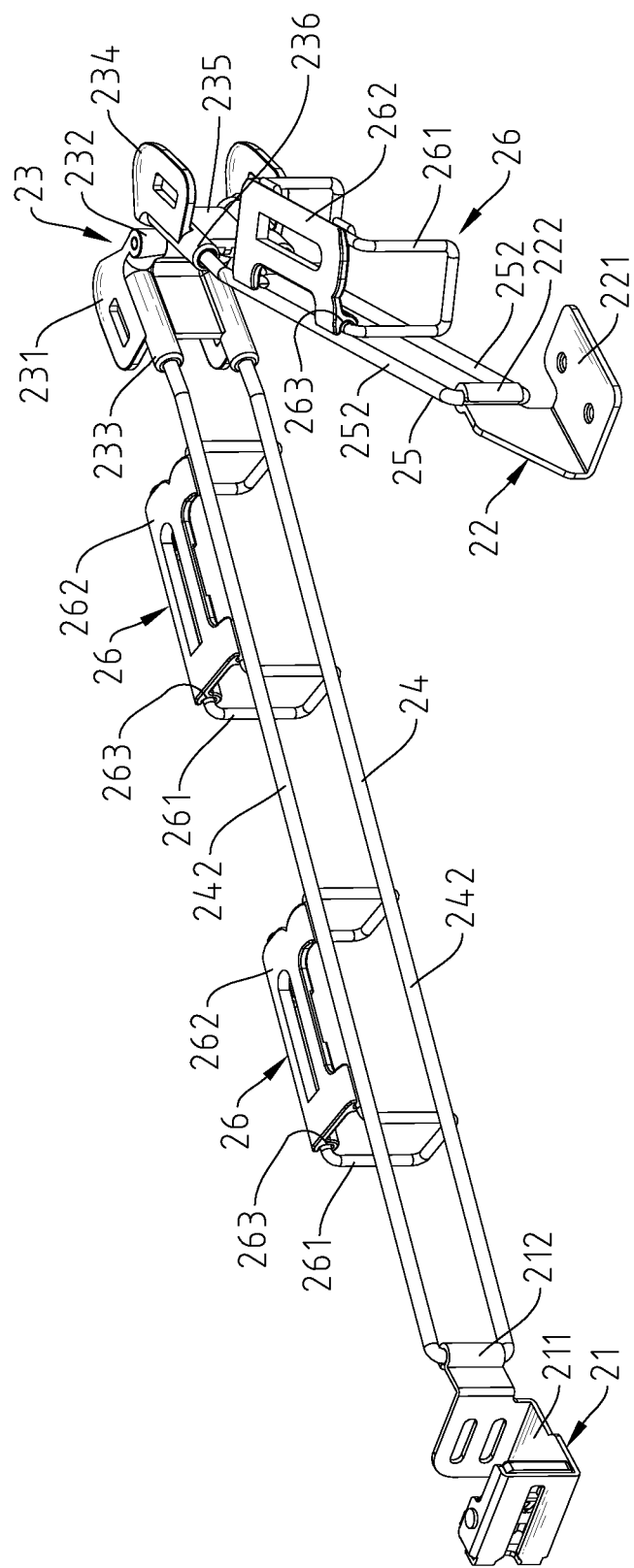
FIG. 4 is an oblique top elevational view of one cable management rack of the cable management system in accordance with the present invention.
Figure 5:
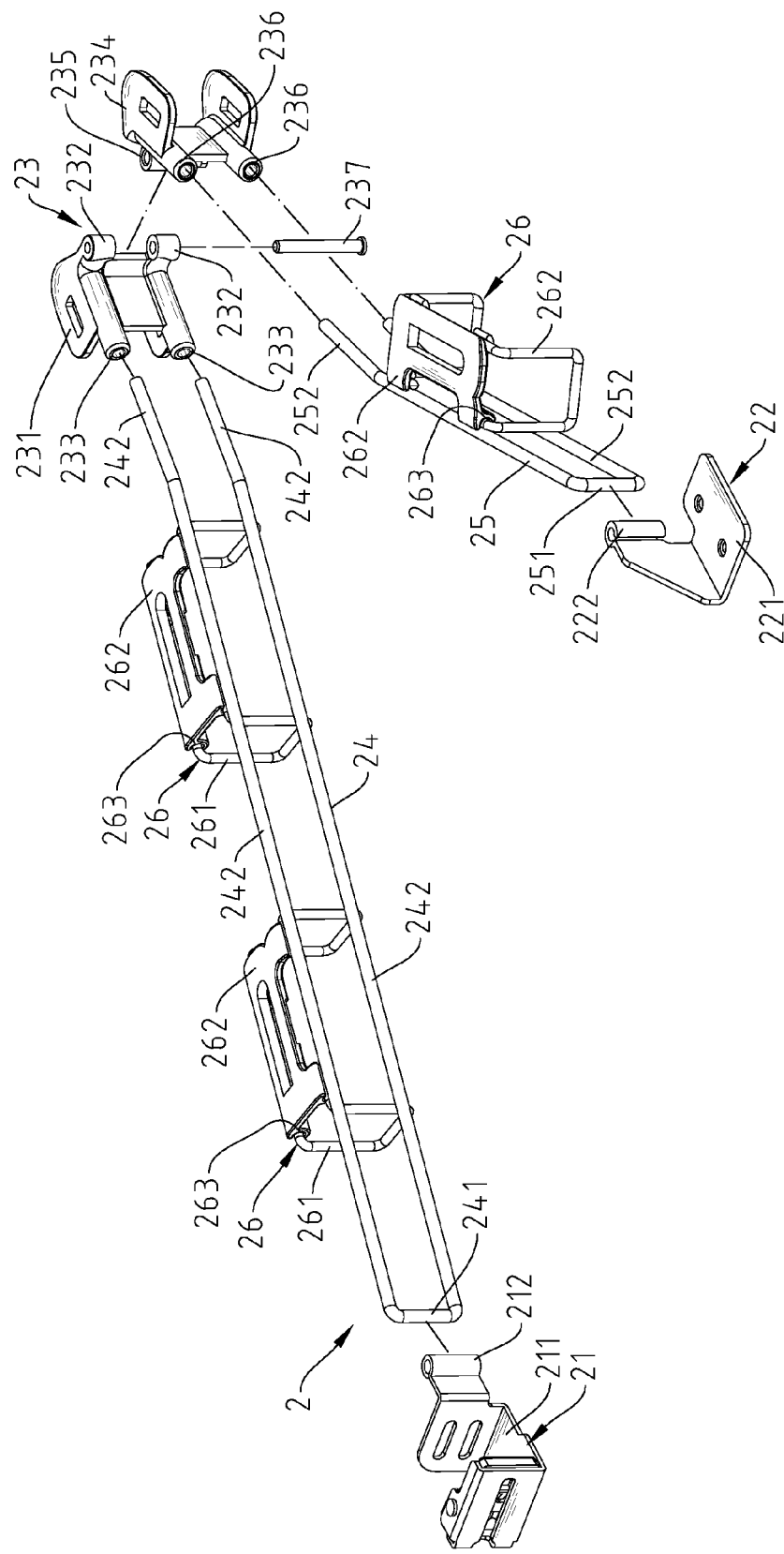
FIG. 5 is an exploded view of one cable management rack of the cable management system in accordance with the present invention.
Figure 6:
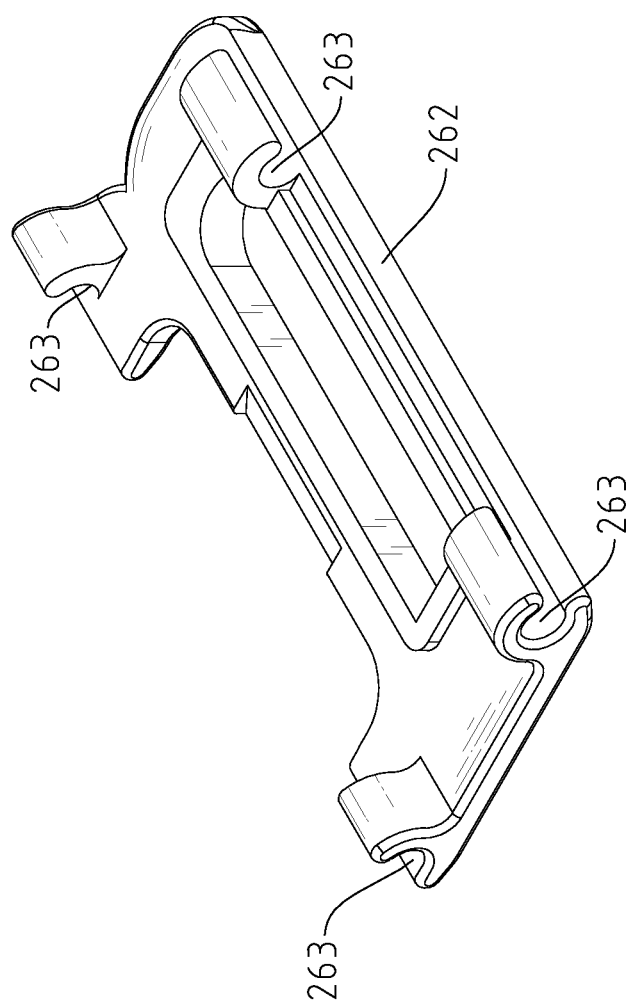
FIG. 6 is an oblique top elevational view of the top cover plate in accordance with the present invention.

Referring to FIGS. 1-6, a cable management system in accordance with the present invention is shown. The cable management system comprises a sliding rail set 1 and a plurality of cable management racks 2.

The sliding rail set 1 comprises two outer rails 11 respectively affixed to two opposite inner walls of a machine housing 3, two intermediate rails 12 respectively slidably coupled to the outer rails 11, two inner rails 13 respectively slidably coupled to the intermediate rails 12, two locating plates 14 respectively affixed to the outer rails 11 at one end for stopping the respective inner rails 13 and the respective intermediate rail 12, and a link 15 coupled between the two intermediate rails 12.

Each cable management rack 2 comprises a first mounting member 21, a second mounting member 22, a hinge 23, a first support member 24, a second support member 25, and a plurality of cable holder frame 26. The hinge 23 is connected between the first mounting member 21 and the second mounting member 22. The first support member 24 is connected between the first mounting member 21 and the hinge 23. The second support member 25 is connected between the second mounting member 22 and the hinge 23. The first mounting member 21 comprises a first mounting base 211, and a first knuckle 212 extended from one end of the first mounting base 211. The second mounting member 22 comprises a second mounting base 221, and a second knuckle 222 extended from one end of the second mounting base 221. The hinge 23 comprises a first hinge plate 231 and a second hinge plate 234. The first hinge plate 231 comprises at least one, for example, two first barrels 232 located at one end thereof and axially aligned in line, and two first receptacles 233 disposed in parallel at an opposite end thereof. The second hinge plate 234 comprises at least one, for example, one second barrel 235 located at one end thereof and axially aligned in line, and two second receptacles 236 disposed in parallel at an opposite end thereof. The second barrel 235 of the second hinge plate 234 is pivotally connected between the two first barrels 232 of the first hinge plate 231 by a pivot pin 237. The first support member 24 and the second support member 25 are respectively made of a metal wire rod that is bent into a predetermined shape. The first support member 24 comprises a first pivot connection portion 241 transversely located at one end thereof, and two first plug tips 242 longitudinally disposed at an opposite end thereof in a parallel manner. The first pivot connection portion 241 of the first support member 24 is pivotally coupled to the first knuckle 212 of the first mounting member 21 such that the first knuckle 212 surround the first pivot connection portion 241 of the first support member 24. The two first plug tips 242 of the first support member 24 are respectively fastened to the first receptacles 233 of the first hinge plate 231. The second support member 25 comprises a second pivot connection portion 251 transversely located at one end thereof, and two second plug tips 252 longitudinally disposed at an opposite end thereof in a parallel manner. The second pivot connection portion 251 of the second support member 25 is pivotally coupled to the second knuckle 222 of the second mounting member 22 such that the second knuckle 222 surrounds the second pivot connection portion 251 of the second support member 25. The two second plug tips 252 of the second support member 25 are respectively fastened to the second receptacles 236 of the second hinge plate 234. Further, the cable holder frame 26 comprises a frame base 261 made by bending a metal wire rod into shape, and a top cover plate 262 covered on a top side of the frame base 261. The frame bases 261 of the cable holder frames 26 are respectively affixed to the first support member 24 and the second support member 25 at an outer side and spaced along the length thereof away from the first plug tips 242 and the second plug tips 252. Further, the top cover plate 262 of each cable holder frame 26 comprises a plurality of retaining grooves 263 fastened to the associating frame base 261.

Further, the cable management racks 2 are arranged at opposing front and rear sides relative to the link 15. The first mounting base 211 of the first mounting member 21 of the cable management rack 2 at the front side of the link 15 is affixed to one inner rail 13 of the sliding rail set 1. The second mounting bases 221 of the second mounting members 22 of the cable management racks 2 are affixed to a middle part of the link 15. The first mounting base 211' of the first mounting member 21' of the cable management rack 2 at the rear side of the link 15 is affixed to one locating plate 14 of the sliding rail set 1.

Figure 7:
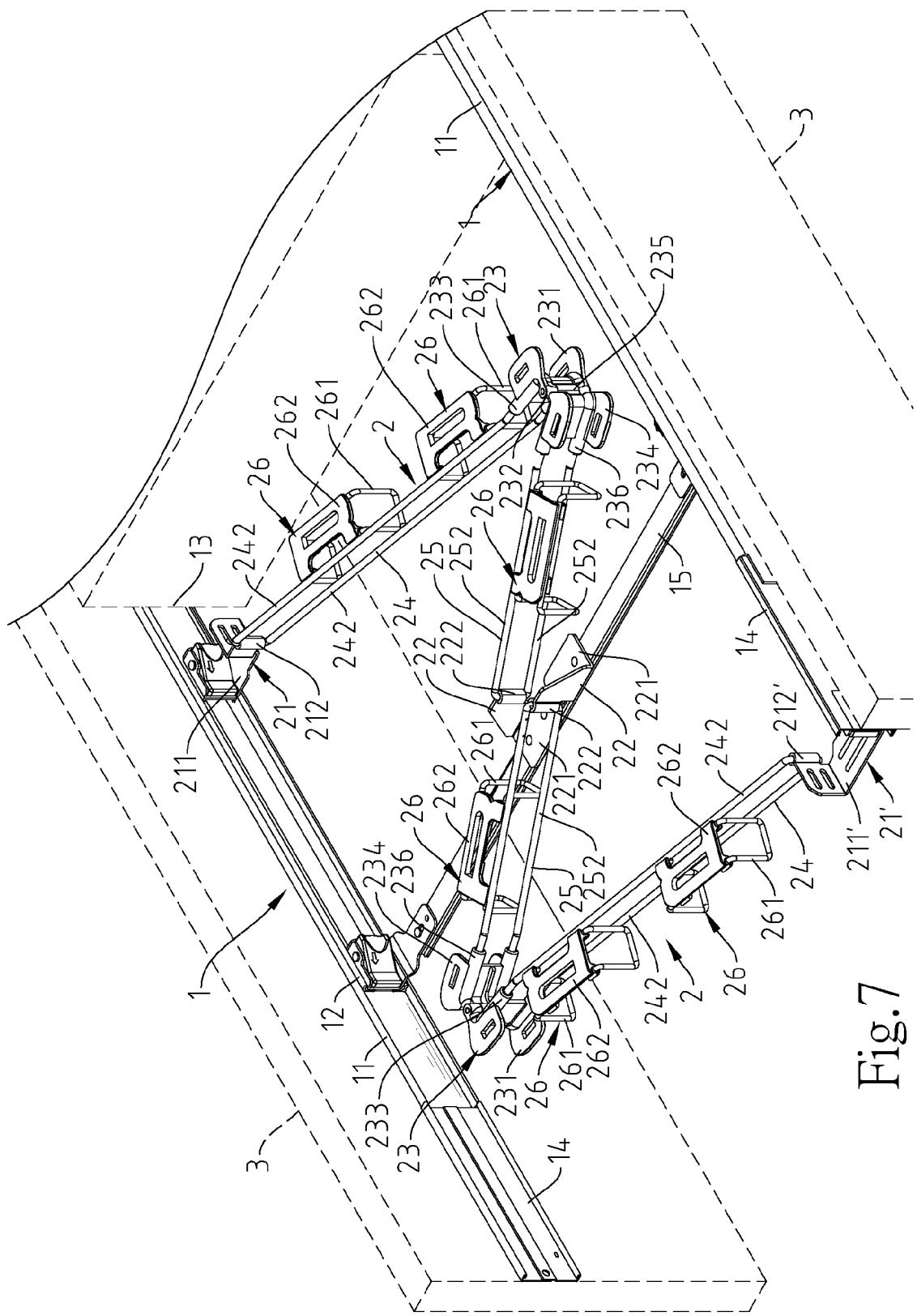
FIG. 7 is a schematic drawing illustrating an application example of the cable management system in accordance with the present invention.

Referring to FIGS. 2-7, after fastened an electronic device 4 to the two inner rails 13 of the sliding rail set 1, the electronic device 4 are positioned in the cable holder frames 26 of the cable management racks 2. When the electronic device 4 is pulled out of the machine housing 3, the first support members 24 and second support members 25 of the cable management racks 2 are biased relative to the respective hinges 23 and extended out. When the electronic device 4 is pushed back into the inside of the machine housing 3, the first support members 24 and second support members 25 of the cable management racks 2 are biased relative to the respective hinges 23 and collapsed. Because the first support members 24 and the second support members 25 are respectively made by binding one respective metal wire rod into shape, and therefore, a large open space is defined between the two first plug tips 242 of the first support member 24 and the two second plug tips 252 of the second support member 25 for air circulation, minimizing the shielding area at the rear side of the electronic device 4 and enabling the electronic device 4 to dissipate heat rapidly. Similarly, the frame bases 261 of the cable holder frames 26 of the cable management racks 2 are also respectively made by bending one respective metal wire rod in shape, and therefore, a large open space is defined in each frame base 261 for air circulation, minimizing the shielding area at the rear side of the electronic device 4.

What the invention claimed is:

1. A cable management system, comprising a sliding rail set and at least one cable management rack connected to said sliding rail set, each said cable management rack comprising a first mounting member, a second mounting member, a hinge, a first support member and a second support member, said hinge being coupled between said first mounting member and said second mounting member, said first support member being coupled between said first mounting member and one end of said hinge, said second support member being coupled between said second mounting member and an opposite end of said hinge, wherein:
said hinge comprises a first hinge plate, a second hinge plate and a pivot pin, said first hinge plate comprising at least one first barrel located at one end thereof and two first receptacles located at an opposite end thereof, said second hinge plate comprising at least one second barrel located at one end thereof and pivotally connected to said at least one first barrel of said first hinge plate by said pivot pin and two second receptacles located at an opposite end thereof; said first support member and said second support member respectively comprising a U-shaped wire rod, said first support member comprising a first pivot connection portion located at one end thereof and pivotally connected to said first mounting member and two first plug tips located at an opposite end thereof and respectively fastened to said first receptacles of said first hinge plate, said second support member comprising a second pivot connection portion located at one end thereof and pivotally connected to said second mounting member and two second plug tips located at an opposite end thereof and respectively fastened to said second receptacles of said second hinge plate;
wherein a link is coupled between a first side and an opposing second side of the sliding rail set, and the at least one cable management rack comprises a front cable management rack disposed at a front side relative to said link and a rear cable management rack disposed at a rear side relative to said link, the first mounting member of the front cable management rack coupled to the first side of the sliding rail set, the first mounting member of the rear cable management rack affixed to the opposing second side of the sliding rail set, and the second mounting members of the front cable management rack and the rear cable management rack are fixed to a middle portion of the link.

2. The cable management system as claimed in claim 1, wherein said first mounting member of each said cable management rack comprises a first mounting base, a first knuckle extending from one end of said first mounting base and pivotally mounted around said first pivot connection portion of the associated said first support member; and the second mounting member of each said cable management rack comprises a second mounting base, a second knuckle extending from one end of said second mounting base and pivotally mounted around said second pivot connection portion of the associated said second support member.

3. The cable management system as claimed in claim 1, wherein each said cable management rack further comprises a plurality of cable holder frames, the cable holder frames mounted at the respective said first support member and said second support member, each said cable holder frame comprising a frame base comprising a wire rod in a predetermined shape and a top cover plate covering a top side of said frame base, said frame bases of said cable holder frames being respectively affixed to said first support member and said second support member and spaced along the length thereof away from said first plug tips and said second plug tips.

4. The cable management system as claimed in claim 3, wherein said top cover plate of each said cable holder frame comprises a plurality of retaining grooves fastened to the associating said frame base.

5. The cable management system as claimed in claim 1, wherein said sliding rail set comprises two opposing outer rails, two intermediate rails respectively slidably coupled to said outer rails, two inner rails respectively slidably coupled to said intermediate rails, and two locating plates respectively affixed to said outer rails at one end, the link coupled between said two intermediate rails; said first mounting member of said front cable management rack being affixed to one said inner rail of said sliding rail set, the first mounting member of said rear cable management rack being affixed to one said locating plate of said sliding rail set.

\* \* \* \* \*